(12) United States Patent  
Cormont et al.

(10) Patent No.: US 7,480,030 B2  
(45) Date of Patent: Jan. 20, 2009

(54) METHOD AND DEVICE FOR LITHOGRAPHY BY EXTREME ULTRAVIOLET RADIATION

(75) Inventors: Philippe Cormont, Le Bouscat (FR); Pierre-Yves Thro, Gif-sur-Yvette (FR); Charlie Vacher, Paris (FR)

(73) Assignee: Commissariat a l'Energie Atomique, Paris (FR)

( * ) Notice: Subject to any disclaimer, the term of this patent is extended or adjusted under 35 U.S.C. 154(b) by 457 days.

(21) Appl. No.: 10/570,726

(22) PCT Filed: Sep. 1, 2004

(86) PCT No.: PCT/FR2004/002226

§ 371 (c)(1),  
(2), (4) Date: Mar. 6, 2006

(87) PCT Pub. No.: WO2005/029191

PCT Pub. Date: Mar. 31, 2005

(65) Prior Publication Data

US 2007/0127007 A1    Jun. 7, 2007

(30) Foreign Application Priority Data

Sep. 5, 2003    (FR) ................................. 03 10547

(51) Int. Cl.  
    *G03B 27/72*      (2006.01)

(52) U.S. Cl. ........................................ 355/69

(58) Field of Classification Search .................. 355/53, 355/69, 77; 250/504  
See application file for complete search history.

(56) References Cited

U.S. PATENT DOCUMENTS 4,504,964 A     3/1985    Cartz et al.

(Continued)

FOREIGN PATENT DOCUMENTS

FR     2 814 599     3/2002

(Continued)

OTHER PUBLICATIONS

International Search Report for related PCT Application No. PCT/FR04/002226, report dated Mar. 23, 2005.

*Primary Examiner*—Diane I Lee  
*Assistant Examiner*—Steven H Whitesell-Gordon  
(74) *Attorney, Agent, or Firm*—Miller, Matthias & Hull

(57) ABSTRACT

The invention relates to a method and device for photolithography by extreme ultraviolet radiation, using a source resulting from the excitation of plasma by several lasers. The object which is to be photoengraved is displaced behind an irradiation window. The radiation is comprised of N successive current impulses whose surface energy is measured. In particular, each laser emits a quantum of energy having a given duration at each outset. The surface energy of the radiation received by the object in the course of the last N−1 pulses is thus added up for an $n^{th}$ iteration of an iterative method. The photosensitive object is displaced from a distance equal to a fraction 1/N of the width of the irradiation window according to the axis of said translation. The above-mentioned sum is subtracted from the amount of total energy required for the photoengraving method. The remaining amount of energy to be provided in order to achieve the total amount of energy and from there, the remaining pulse quanta number to be produced for an $n^{th}$ pulse is determined by selecting more particularly the corresponding number of laser sources to be turned on. The lasers thus selected are then triggered in order to deliver a pulse.

15 Claims, 5 Drawing Sheets

U.S. PATENT DOCUMENTS

| | | |
|---|---|---|
| 6,038,279 A | 3/2000 | Miyake et al. |
| 6,222,615 B1 * | 4/2001 | Suzuki ........................ 355/68 |
| 6,307,913 B1 | 10/2001 | Foster et al. |
| 2004/0022295 A1 | 2/2004 | Weulersse et al. |

FOREIGN PATENT DOCUMENTS

| | | |
|---|---|---|
| JP | 08 213 192 | 8/1996 |
| WO | WO 0227872 A1 * | 4/2002 |

* cited by examiner

METHOD AND DEVICE FOR LITHOGRAPHY BY EXTREME ULTRAVIOLET RADIATION

CROSS REFERENCE TO RELATED APPLICATION

This is the U.S. National Phase of International Application No. PCT/FR2004/002226 filed 01 Sep. 2004, the entire disclosure of which is incorporated herein by reference.

FIELD OF THE INVENTION

The invention relates to extreme ultraviolet photolithography, especially for the fabrication of integrated circuits.

BACKGROUND OF THE INVENTION

In order to subject an object, such as a future integrated circuit, to a photolithography operation, chosen zones of the object, precoated with a photoresist, are exposed to a source of radiation in the visible or in the ultraviolet. This radiation exposes the aforementioned zones and consequently results in local etched features in the object.

As a general rule, the etched features are finer the shorter the wavelength of the radiation. Document EP-1 222 842 has proposed a source of radiation in the extreme ultraviolet (called EUV hereafter) and its application to photolithography. The wavelength of the radiation extends from about 8 nanometers to about 25 nanometers, making it possible to achieve etched features with a fineness of typically less than around 100 nanometers. The radiation emanates from a plasma, which is the site of interaction between a laser beam and a mist comprising micron-sized xenon and/or water droplets. The laser source may be in the form of a nanosecond laser of Nd:YAG type. It excites a jet of particles output by a nozzle, thus forming the aforementioned mist of droplets.

Also known, from the publication WO 02/32197, is extreme ultraviolet radiation resulting from the excitation of a jet of liquid xenon.

In a more recent development, described in publication FR-2 814 599, EUV radiation is obtained by the interaction between several laser beams and a jet of particles, such as a xenon mist. In particular, laser sources are designed to emit shots substantially in one and the same region of the jet and substantially at the same time. Thus, it will be understood that, by combining several laser sources that irradiate the jet of particles substantially at the same time, the peak power of the radiation that produces the plasma is increased. The frequency of the laser shots is of the order of one to a few tens of kHz. Thus, the expression "substantially at the same time" means that, at each firing period, for example every 0.1 ms, a certain number of individual light pulses, each generated by an individual laser, are grouped together into a collection of pulses that are simultaneous and/or juxtaposed over time, these being called composite pulses. Optionally, this juxtaposition may constitute two groups of pulses and two respective instants, namely a first group for striking the plasma and a second group for increasing it, the time shift between these two groups being much shorter than the shot repetition period. However, it should be noted that the shift of the individual pulses in space and time has the purpose of adapting the energy influx to the requirements of the plasma in accordance with its temporal evolution, so as to improve the energy balance. The device described does not in any way seek to make a fine adjustment of the light power delivered.

Since the publication of this document FR-2 814 599, the expectations of industrial companies demanding an etching process in the extreme ultraviolet have grown significantly. At the present time, these industrial companies require, in the manner of the Dutch consortium ASML:

a substantially continuous fabrication process, with a run speed of the semiconductor wafer to be irradiated of 400 mm/s;

an extreme ultraviolet pulse repetition frequency of 10 kHz;

at each point on the surface to be irradiated, a cumulative extreme ultraviolet does of 5 $mJ/cm^2$, provided by a succession of 50 pulses; and this received dose having an error distribution that has to be less than 0.1% of the setpoint.

The last constraint mentioned represents already by itself a technological challenge with no solution in the prior art to the knowledge of the inventors. This is because certain phenomena associated with the generation of a plasma by laser illumination of a target, especially when the latter consists of xenon aggregates, are still poorly understood or, at the least, are the subject of much uncertainty. The position of the jet of particles and laser beams may be temporally shifted in terms of position, especially because of substantial temperature variations in the interaction chamber. The jet itself undergoes inevitable fluctuations.

Document U.S. Pat. No. 4,804,978 describes a way of controlling an energy dose for photolithography using attenuator filters mounted on a motorized wheel. However, this solution does not allow operation at a high rate since the laser shots are interrupted while a filter is put into place. Moreover, a continuous relative displacement of the object to be etched with respect to the source is incompatible with this process, which on the contrary requires complete immobility until the cumulative energy dose has been obtained. Finally, the existence of a finite number of filters, corresponding to discrete attenuation values, does not allow the precise cumulative energy dose to be provided.

Document U.S. Pat. No. 6,034,978 describes another way of controlling the stability of the radiation source between two pulses so as to ensure stability of the energy dose delivered. In particular, said document provides a way of controlling the temperature of the gaseous medium, which is the source of the radiation, so as to control the intensity stability of the radiation. Now, this solution cannot be transposed to the device described in FR-2 814 599 since the radiation source is not a plasma, as in FR-2 814 599, but rather a gas laser. Such a system for regulating the emission, by cooling the gas laser by controlled circulation of water, is not easily applicable in the device of FR-2 814 599 with a jet of particles in the form of a mist. Firstly, such a process cannot take into account the fluctuations in the efficiency of conversion between laser energy and extreme ultraviolet energy, thereby making it impossible to apply it to the generation of extreme ultraviolet radiation by interaction of coherent light on a plasma-generating target. Secondly, in the prior art it does not seem that such a laser is capable of delivering intense pulsed energy at a high rate specified by the ASML consortium.

In conclusion, to the knowledge of the inventors, the prior art neither offers nor suggests any other method or device allowing extreme ultraviolet photoetching which, on the one hand, is effectively continuous, that is to say without steps of the method, other than the displacement of the object, slowing down the rate of the extreme ultraviolet pulses, and which, on the other hand, provides a standard deviation in the distribution of the error in the doses received of the order of 0.1% or less. The aim of the present invention is to satisfy this lack, and it describes a method allowing extreme ultraviolet photoetching, which, on the one hand, is effectively continuous, that is to say without steps of the process other than the displacement of the object slowing down the rate of the extreme ultraviolet pulses and which, on the other hand, provides a standard deviation in the distribution of the error in the doses received of the order of 0.1% or less.

It is another object of the present invention to provide a device for applying this process.

SUMMARY OF THE INVENTION

For this purpose, the present invention firstly provides an extreme ultraviolet photolithograph method in which an object having a plane surface, orthogonal to the radiation, having a photosensitive zone capable of moving transversely to the radiation, receives a predetermined number N of successive pulses in the extreme ultraviolet (N=50 according to the ASML specifications) at each point in the current photosensitive zone exposed to the radiation. The object receives the radiation through an irradiation window of chosen width, said window being substantially stationary relative to the radiation.

The pulses are produced by the impact of at least two coherent light beams output by pulsed laser sources on a target capable of generating a plasma having at least one emission line in the extreme ultraviolet, which pulsed laser sources will hereafter be denoted "lasers" for short. In order for the number of these lasers to remain reasonable despite the magnitude of the instantaneous power and the energy that are required for the plasma to irradiate in the extreme ultraviolet, these lasers, in principle having the same power, each have a high peak power of the order of several hundred kW. They emit pulses with an energy of a few tens of mJ and their mean power is of the order of several hundred watts.

The term "quantum" will be used hereafter to denote the quantity of light energy generated at each shot by such lasers, which are similar to one another, having as far as possible the same laser shot duration $\Delta t$ (for example around 50 nanoseconds) and the same peak power of these shots (ranging, depending on the embodiment chosen, from several hundred kW to more than one MW).

Moreover, the invention requires that this peak power remain below the threshold value $P_{th}$, which results firstly in the plasma being struck and then secondly in the emission by this plasma of at least one line in the extreme ultraviolet. Below this threshold $P_{th}$, the plasma may be struck, but it does not radiate in the extreme ultraviolet.

These laser beams, when they strike the same region of the aforementioned target, generate a plasma possessing at least one emission line in the extreme ultraviolet. The transverse displacement of the object having a zone to be irradiated is chosen so that, between two successive extreme ultraviolet pulses, its amplitude is a fraction 1/N of the width of the irradiation window along the direction of this displacement.

The method according to the invention therefore applies to any photolithograph method in which:
  the object to be lithographed possesses a plane surface, placed orthogonally to the light radiation and having a photosensitive zone, this object being able to be moved transversely to this radiation;
  the radiation carrying out the etching operation includes at least one line in the extreme ultraviolet and consists of N successive current pulses whose energy per unit area through an irradiation window is measured; and
  these radiation pulses are produced by the impact, on a suitable target, of at least two laser beams output by pulsed laser sources chosen from a plurality thereof, each emitting at each triggering a quantum of energy of given duration, these lasers being focused at the same point on the target.

The expression "suitable target" is understood to mean a target capable of emitting a plasma possessing at least one emission line in the extreme ultraviolet. The expression "plurality of laser sources" is understood to mean a number of laser sources sufficient to produce the irradiation necessary for photoetching in N current pulses.

This method is characterized in that it comprises the following iterative steps, stated for an nth iteration:
  a) integration of the energy per unit area of extreme ultraviolet radiation that has passed through the irradiation window during the N−1 last pulses;
  b) during the time interval separating two successive radiation pulses, translation of the photosensitive object through a distance equal to a fraction 1/N of the width of the irradiation window along the axis of this translation;
  c) subtraction of the integral obtained in step a) from the quantity of energy needed for the photoetching process;
  d) determination of the quantity of energy remaining to be provided in order to reach this quantity of energy;
  e) calculation of the number of pulse quanta remaining to be generated for an nth pulse;
  f) determination of the corresponding number of laser sources to be fired and selection of laser sources whose number is equal to the integer part of this number; and
  g) synchronous triggering of the lasers selected at step f), these steps a) to g) being repeated for the next current point.

In the most general case, the number of laser sources calculated at step f) is fractional, and the fractional part of this number corresponds to an influx of energy of less than one quantum.

According to the method of implementation in which the number of laser sources calculated at step f) is fractional, the quantity of energy less than one quantum, associated with this fractional part of the number of lasers, is provided by a laser source capable of delivering the quantum of energy common to the other laser sources and is triggered with a delay, of less than the duration $\Delta t$ of a quantum, relative to the instant of synchronous triggering of the other laser sources that deliver the integer part of the number of quanta of the same current pulse.

This is because, in such a case, the pulse providing the fractional part of a quantum lasts longer than the extinction of the lasers that are chosen at step f) above and are intended to provide the integer part of the number of lasers. This pulse is then alone, so that the overall instantaneous power becomes less than the threshold $P_{th}$ that causes the plasma to emit at least one line in the extreme ultraviolet. Thus, that part of the quantum of energy after the extinction of the first lasers of this same current pulse no longer makes any contribution to the extreme ultraviolet radiation. This in fact amounts to a fractional quantum, but by means of a laser identical to the lasers that generate a quantum. This same laser can, during another current pulse, generate an integer quantum. This also provides flexibility and very high precision in the adjustment of the laser power.

According to a second preferred method of implementation, in which the number of laser sources calculated at step f) is fractional, the quantity of energy less than one quantum, associated with this fractional part of the number of lasers, is provided by several laser sources capable of delivering the same quantum of energy as the other laser sources of which:

the first is triggered with a delay of $(1-k_1)\Delta t$, where $0<k_1<1$, after the instant of triggering of the synchronous lasers that represent the integer part of the number of lasers;

the second is triggered with a delay of $(1-k_2)\Delta t$, where $k_1<k_2<1$, after the instant of triggering of the synchronous lasers that represent the integer part of the number of lasers;

and so on, the qth being triggered with a delay of $(1-k_q)\Delta t$, where $0<k_q<1$, after the instant of triggering of the synchronous lasers that represent the integer part of the number of lasers; and, furthermore the sum of these delays is less than the duration $\Delta t$ of a quantum.

The coefficient k is preferably chosen to be proportional to the fractional part of the number of lasers.

In a third preferred method of implementation, in which the number of laser sources calculated at step f) is fractional, the quantity of energy less than one quantum, associated with this fractional part of the number of lasers, is provided by a laser source capable of delivering an amount of energy of less than one quantum and triggered with a delay, of less than the duration $\Delta t$ of a quantum, relative to the instant of synchronous triggering of the other laser forces that deliver the integer part of the number of quanta in the same current pulse.

In a fourth preferred method of implementation, which combines the two previous ones, in which the number of laser sources calculated at step f) is fractional, the quantity of energy less than one quantum, associated with this fractional part of the number of lasers, is provided by several laser sources capable of delivering a quantity of energy less than one quantum of which:

the first is triggered with a delay of $(1-k_1)\Delta t$, where $0<k_1<1$, after the instant of triggering of the synchronous lasers that represent the integer part of the number of lasers;

the second is triggered with a delay of $(1-k_2)\Delta t$, where $k_1<k_2<1$, after the instant of triggering of the synchronous lasers that represent the integer part of the number of lasers;

and so on, the qth being triggered with a delay of $(1-k_q)\Delta t$, where $0<k_q<1$, after the instant of triggering of the synchronous lasers that represent the integer part of the number of lasers; and, furthermore the sum of these delays is less than the duration $\Delta t$ of a quantum.

The subject of the present invention is also a device for applying the method of the invention. The extreme ultraviolet photolithography device then comprises:

a source of extreme ultraviolet radiation, comprising at least two laser beams output by pulsed laser sources, each emitting a quantum of energy of given duration during a laser shot and capable of exciting one and the same region of a target that is able to emit a plasma possessing at least one emission line in the extreme ultraviolet;

an irradiation window of chosen width, interposed between the radiation source and the object and stationary relative to the radiation source; and means for the transverse displacement, relative to the window, of an object to be photolithographed that has a plane surface, orthogonal to the radiation, and has a photosensitive zone, said displacement being chosen so that, between two successive pulses of extreme ultraviolet radiation, the transverse displacement of the object relative to the irradiation window is a fraction 1/N of the width of this window in the direction of the displacement, in such a way that any one band of said zone of the object is exposed to a predetermined number N of successive pulses in the extreme ultraviolet, The device according to the invention further includes:

means for measuring the peak power of the radiation through the irradiation window;

means for calculating, for the current nth pulse to be delivered:

the sum of the measured energy of the extreme ultraviolet radiation of the N−1 last pulses, that is to say, the integral of the irradiation peak power over the complete duration of the N−1 last pulses, the quantity of energy remaining to be delivered by the next nth pulse, by comparing said sum with a predetermined total energy dose needed for the photoetching, and the number of quanta of energy that the laser sources have to deliver in order to obtain said quantity of energy of said nth pulse, taking account of the fact that the laser light pulses of instantaneous power of less than the threshold power will not contribute towards generating the extreme ultraviolet radiation; and means for selecting and controlling, synchronously, a chosen number of lasers according to the calculated number of quanta.

The means for displacing the object to be photoetched relative to the radiation are active, so as subsequently to displace the object by an increment equivalent to said fraction 1/N of the width of the window.

According to the first variant in which the fractional part of the number of lasers is represented by a quantum of energy delayed with respect to the synchronous triggering of the preceding lasers, the invention further includes means capable of generating such delays according to the value of the fractional part of the number of lasers, in order to generate said nth current pulse.

According to a preferred embodiment, said target is a directed jet of xenon microdroplets in the form of a mist. As a variant, this target may be a liquid xenon jet as described in the aforementioned publication According to a preferred embodiment, which can be combined with the previous one, the laser shots are output by pulsed solid-state lasers operating as oscillators and pumped by continuously operating diodes.

Certain types of laser operate more effectively when their rod, once charged, is completely discharged before the next pumping phase. To meet this constraint, the system for controlling the lasers according to the invention may be designed, in one variant, so that the quanta of energy that are not required for a current pulse are triggered outside this pulse, separately, so that they never exceed the threshold $P_{th}$.

BRIEF DESCRIPTION OF THE DRAWINGS

Other features and advantages of the invention will become apparent on examining the detailed description below and the appended drawings in which.

DESCRIPTION OF PREFERRED EMBODIMENTS

It should be pointed out that the method and the device according to the invention are, in general, applied to the photolithography of integrated circuits.

What is produced over an area of a few mm² and over a thickness of a few microns is an assembly that may comprise several thousand components. The starting material is a silicon wafer with a diameter of about ten cm. This disk undergoes several chemical treatments (thin-film deposition, doping, etc.). Several integrated circuits are therefore fabricated on the same silicon wafer. One of the key treatments in the fabrication of integrated circuits is photolithography.

Figure 1:
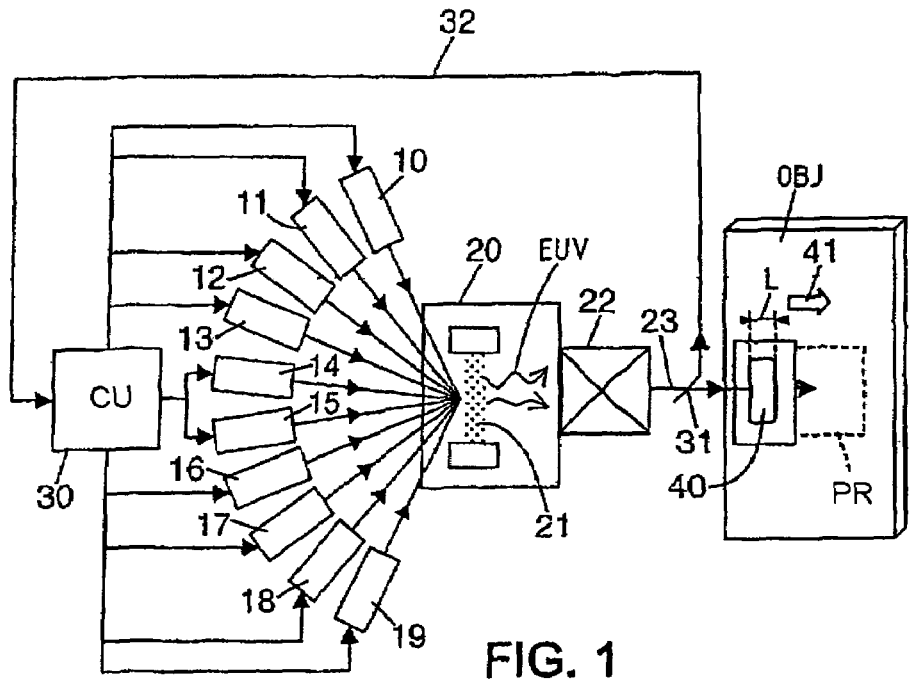
FIG. 1 illustrates schematically a device for implementing the photolithograph method according to the invention.

FIG. 1 shows a wafer OBJ to which EUV (extreme ultraviolet) radiation 23 is applied for the purpose of carrying out a photolithography operation on the wafer. More particularly, the object OBJ to undergo photolithography has a plane surface, orthogonal to the radiation 23, and possesses a photosensitive zone coated with a photoresist PR, capable of moving (arrow 41) transversely to this radiation 23.

To prepare this phase, the silicon wafer is preheated to above 1000° C. The surface of the wafer oxidizes, forming a thin insulating film of silicon oxide. Next, a photoresist PR is applied, to the zone that has to be photosensitive, in order to locally cover the surface of the wafer OBJ. The silicon wafer OBJ is then exposed to the radiation 23, preferably using a mask (not shown) capable of representing the desired photo-etching pattern. This step in the integrated circuit fabrication process is called "exposure". The photolithography precision obtained, and therefore the line width of the integrated circuit, depends on the wavelength of this radiation. At the present time, these wavelengths are in the visible or the ultraviolet. To obtain an etching resolution of 40 nm, an EUV source emitting radiation at a wavelength of 13.5 nm has recently been developed, with a preferred repetition rate of 10 kHz in the case of photolithography. EUV emission is obtained by the interaction between a preferred number of ten pulsed Nd:YAG laser beams emitting at a mean rate of 10 kHz in the infrared (solid-state lasers) and a continuous xenon jet. A hot plasma emitting radiation at a wavelength of 13.5 nm is obtained.

FIG. 1 shows laser sources, referenced 10 to 19, which are capable of exciting a jet of particles 21 passing through an interaction chamber 20. Preferably, this jet of particles 21 comprises a directional mist of xenon microdroplets. More particularly, the lasers 10 to 19 are capable of sending laser shots that are focused onto one and the same region of the jet 21.

The active lasers, each sending a shot with the energy of one quantum onto the jet of particles, excite said jet and tend to create a plasma therein. If the total energy contribution of the quanta exceeds a threshold value $P_{th}$ (corresponding to the extreme ultraviolet emission threshold), the interaction plasma is struck and the emission line in the extreme ultraviolet then appears for a time corresponding approximately to the time during which the laser pulse exceeds the threshold $P_{th}$. In FIG. 1, the arrows referenced EUV indicate the occurrence of such a pulse of extreme ultraviolet radiation. This pulse propagates over a wide solid angle, and an optical collector (not shown) is used to collect this radiation and direct it towards the object to be photoetched.

Figure 2A:
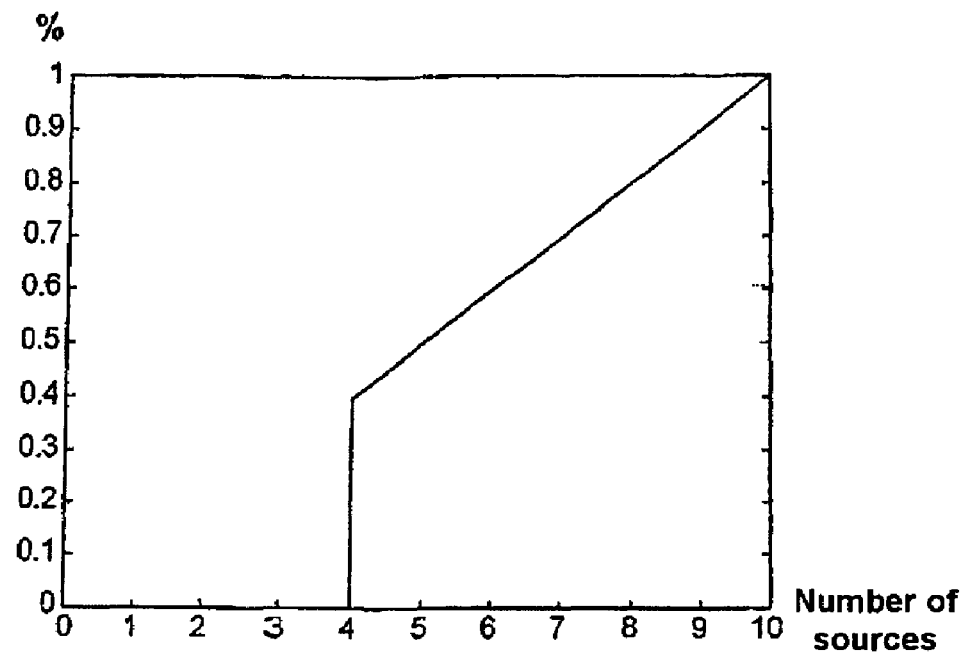
FIG. 2a shows schematically the variation in the emission coefficient of the EUV radiation source as a function of the number of active laser sources at the same time.
Figure 2B:
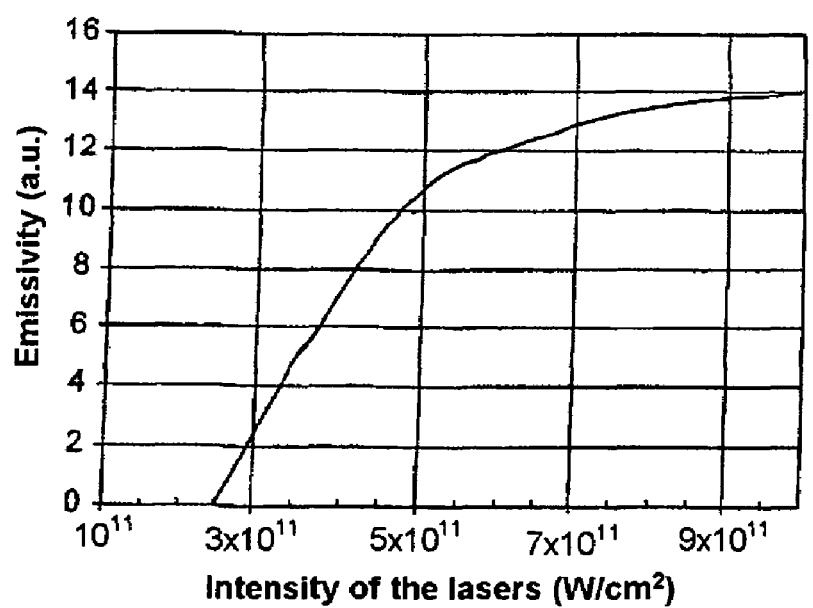
FIG. 2b shows schematically the variation in the emissivity of the EUV source as a function of the energy delivered by the laser shots.

FIG. 2a shows schematically, by way of example, the emission coefficient of the EUV source (as a percentage) plotted as a function of the number, of active laser sources that are firing shots at the same time onto the jet of particles. In the example described, four laser sources are sufficient to strike the plasma. The more exhaustive representation shown in FIG. 2b of the emissivity (in arbitrary units) plotted as a function of the energy delivered by the laser shots indicates that about $2.5 \times 10^{11}$ W/cm² of power delivered to the jet of particles is needed, in the example described, to heat the plasma.

Figure 3A:
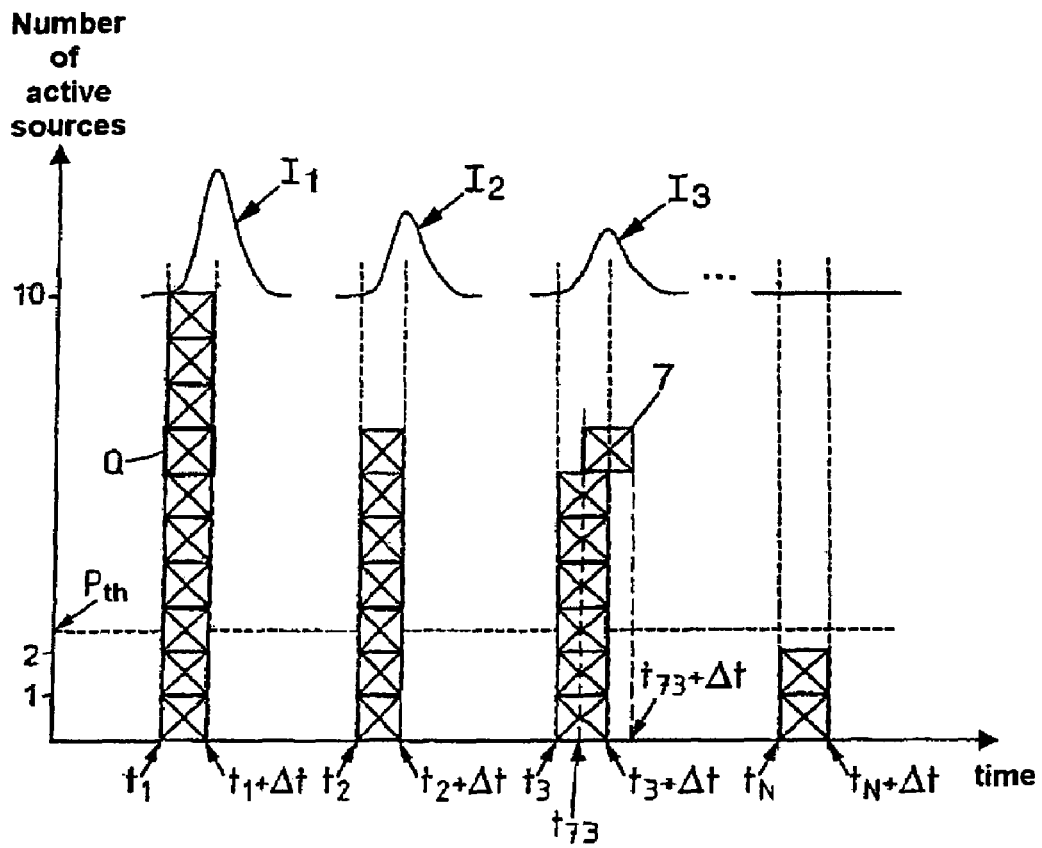
FIG. 3a shows schematically the contribution of the laser shots as a function of the time in order to form EUV pulses of adjusted energy.

Referring again to FIG. 1, a control unit 30 sends a signal to actuate each laser source 10 to 19 so as to form, or not, an EUV pulse at a given instant. In a preferred embodiment, a time delay is effected between the laser shots needed to deliver a pulse at a given instant, in particular for the purpose of adjusting the energy of this pulse. FIG. 3a shows very schematically the emitted pulses $I_1$, $I_2$, $I_3$ plotted as a function of the number of active laser sources and the instant of the laser shots. In the example described, all the laser sources are identical or, at the least, provide the plasma with the same energy during a laser shot. This is the reason why it has been chosen to call this energy a "quantum". Each laser source here sends a shot of the same duration $\Delta t$ (typically around 40 nanoseconds in the case of an Nd:YAG solid-state laser) and the same peak power. However, an alternative solution consisting in choosing laser sources capable of sending shots of different peak power and/or different duration $\Delta t$ is also envisioned in order to further refine the energy of the pulses emitted. In this case, the energy quanta that the laser sources deliver may differ from one laser source to another.

Thus, in FIG. 3a, each quantum Q of energy delivered by the source is represented by a square with two intersecting diagonals. To deliver a pulse $I_1$ of maximum energy, all ten laser sources are activated simultaneously at the instant $t_1$. The plasma, which reacts to the excitation by the laser shots, delivers the EUV pulse $I_1$, the maximum energy of which is reached at approximately the instant $t_1 + \Delta t$. To deliver a pulse $I_2$ of lower energy than $I_1$, only seven laser sources in the example shown are used. Thus, it will be understood that the energy of the EUV pulse delivered is proportional to the stack of quanta Q, and therefore to the number of laser sources that are active at the same time. In one particularly advantageous embodiment, to deliver a pulse $I_3$ having an energy that does not correspond to an integer number of quanta Q, it is chosen to delay the firing of one or more laser sources. Thus, in the example shown in FIG. 3a, to deliver the third pulse $I_3$, the seventh laser source is activated at an instant $t_{73}$, delayed by a time of less than $\Delta t$ relative to the same instant $t_3$ of all the other shots. Thus, the quantum bearing the reference 7 in FIG. 3a is delayed by a fraction of the specific duration $\Delta t$, relative to the other quanta therebelow. In the example shown, the left-hand part of the quantum 7 (which, together with the other quanta, contributes to the radiation) provides the plasma with substantially one half of the quantum of energy for delivering a pulse, whereas the right-hand part provides a half-quantum, which is insufficient to sustain the reaction plasma and therefore is not involved in the energy of the EUV radiation. The repetition period of the pulses $I_1$, $I_2$, $I_3$, is of the order of 0.1 milliseconds. It will be understood that a typical value of the order of a few tens of nanoseconds for the duration $\Delta t$ of a laser shot is much shorter than the period of the EUV pulses. Thus, even if a time delay between the laser shots of any one salvo is effected overall, these shots repeatedly take place at substantially recurrent instants, which define the EUV pulse repetition period. The time delay between shots of any one salvo therefore in no way disturbs the pulse emission frequency.

FIG. 3a shows, purely by way of illustration, a stack of two quanta that have the same instant of firing $t_N$. To simplify the reasoning, it will be assumed therefore that the instantaneous power of a quantum is slightly below one half of the threshold $P_{th}$. Thus, in this figure, the energy provided the stack at the instant $t_N$ is insufficient to strike the plasma at this instant $t_N$. In reality, we need generally between one and two quanta in order to reach this threshold $P_{th}$ It should be pointed out that in the embodiment described here the laser sources must fire repetitively so as to drain the energy stored in the laser rod. Thus, referring to FIG. 3b, the ten lasers 10 to 19 can fire with a time delay between the shots, barely exceeding the necessary energy threshold (corresponding in the figure to more than four quanta Q, but in practice to a little more than the instantaneous power of one quantum) for striking the plasma and for generating a pulse specifically in the EUV at the instant $t_i$. Advantageously, it is thus possible to fire all the lasers without thereby at all reaching the maximum energy of the pulse $I_1$ described above. Thus, the shots delayed with respect to the instant $t_i$ do not contribute to the useful energy of the source. With regard to the shots following this instant $t_i$, it should be pointed out that the time delay may be less precise. This is because, to create the plasma and emit energy in the desired spectral band (in the EUV), the aforementioned strike threshold must be reached. Thus, it is advantageous to choose lasers such that the energy of a single laser does not create a plasma, or creates a plasma that does not emit in the desired spectral band.

Figure 3B:
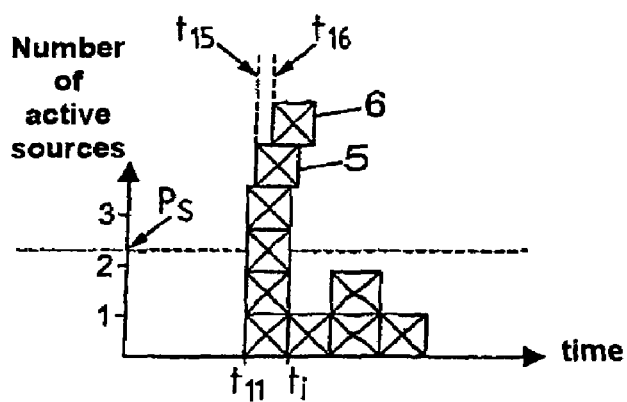
FIG. 3b shows schematically an EUV pulse of adjusted energy immediately followed by the triggering of quanta of excess energy, the instantaneous power of which remains below the threshold $P_{th}$.

More particularly, FIG. 3b shows that it is possible to adjust, as desired, the energy contribution of the laser shots to the emission of an EUV pulse. In particular, it is possible to effect a progressive time delay of the shots referenced 5 and 6 in order to generate a pulse, the sum of these delays remaining shorter than the duration $\Delta t$ of a shot.

Thus, the laser shot referenced 5 takes place at an instant $(1-k_1)\Delta t$, where $0<k_1<1$, after the instant $t_{11}$ of ignition-of the preceding lasers and the laser shot referenced 6 takes place at an instant $(1-k_2)\Delta t$, where $k_1<k_2<1$, after the instant $t_{11}$ of ignition of the preceding lasers. Thus, an embodiment for generating a "fractional quantum" (a quantity of energy delivered to the plasma of less than one quantum and thus corresponds to a "fractional part of the number of lasers"), the following are triggered:

the first laser source with a delay of $(1-k_1)\Delta t$, where $0<k_1<1$, after the instant of triggering of the synchronous lasers representing an integer part of the number of lasers;

a second laser source with a delay of $(1-k_2)\Delta t$, where $k_1<k_2<1$ after the instant of triggering of the synchronous lasers representing the integer part of the number of lasers;

and so on, the qth laser source being triggered with a delay of $(1-k_q)\Delta t$, where $0<k_q<1$, after the instant of triggering of the synchronous lasers representing the integer part of the number of lasers, as shown schematically in FIG. 3b.

However, the sum of these delays remains shorter than the duration $\Delta t$ of a quantum. This embodiment may be provided for identical quanta delivered by the lasers, or else for quanta that differ, for example by their peak power, that the various lasers could deliver, as indicated above.

It should be pointed out that the instant that a laser fires can be controlled with a precision of better than a few nanoseconds. Thus, with a shot duration of around 40 nanoseconds, it is possible to introduce at least some ten different time delays for a laser shot to be effected. Thus, it is possible to achieve quantum fractions of the order of substantially one tenth of a quantum in the current state of the art.

To summarize, the following are in this case triggered:
at least a first laser shot at a predetermined instant $t_{11}$ (four laser shots in the example shown in FIG. 3b); and
one or more successive laser shots at respective instants $t_{15}$, $t_{16}$ chosen so as to adjust the energy of a pulse in the extreme ultraviolet to be emitted, these respective instants being distributed over a time interval of shorter than the duration $\Delta t$ of the shots.

Since the energy of a pulse emitted by the plasma depends in general on the peak power of the sum of the laser shots, it has thus been shown that it is possible to vary the energy of this plasma source by introducing a time delay into the laser shots. Advantageously, the energy emitted by the source can be varied very rapidly, and thus the energy of each light pulse can be independently controlled for a source operating with a repetition rate of possibly up to several tens of kHz. The advantage of this solution is also that it does not disturb the thermal equilibrium of the source and it does not detune the set of sources. This is because it has been observed that the source invariably returns to its initial state immediately, depending on the number of simultaneous laser shots. Thus, the source may for example operate at 80% of its maximum energy and the next shot may operate at 100% of its maximum energy. In the example described, the mean frequency of the laser shots, and thus the frequency F of the emitted pulses, is of the order of 10 kHz.

Figure 4:
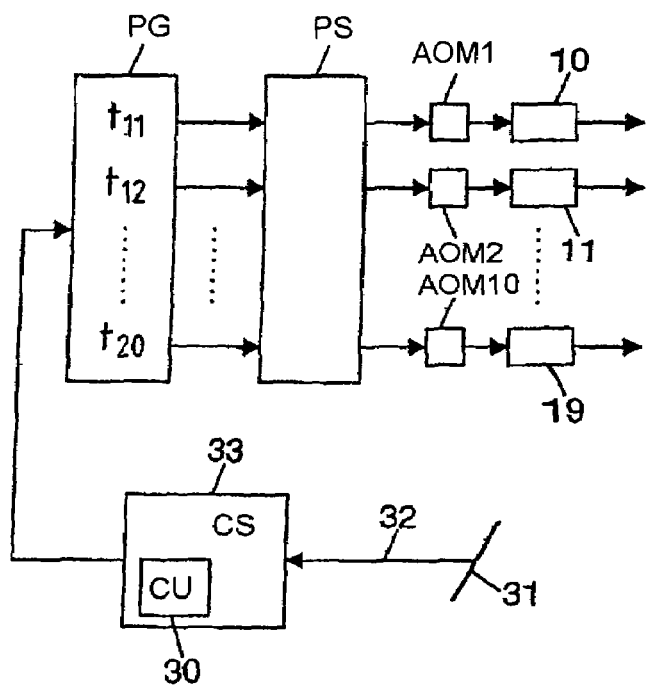
FIG. 4 shows schematically part of a control unit for generating the laser shots.

Another benefit provided by the use of a time delay in the laser shots consists of the fact that such delays can be easily controlled. Specifically, each laser shot is preferably triggered by using an acoustooptic modulator. Referring to FIG. 4, the acoustooptic modulators AOM1 to AOM10, each associated with a laser source 10 to 19, are controlled by a radiofrequency power supply PS (for example operating at 24 MHz, with a power of 100 W for example). This 24 MHz frequency is in particular well above the 10 kHz rate of the shots (by a factor of at least of the order of one thousand). The Nd:YAG laser pulses are triggered by using a single associated acoustooptic modulator, rapidly decreasing the losses in the laser cavity. A pulse generator PG sends the instants of firing $t_{11}$ to $t_{20}$ of each laser source to this radiofrequency power supply PS, which triggers the laser shots at the demanded instants $t_{11}$ to $t_{20}$ in order to trigger a pulse at a time $t_1$. Thus, it will be understood that these instants $t_{11}$ to $t_{20}$ are estimated by the control unit 30 in FIG. 1.

Referring again to FIG. 1, collimation and focusing means 22 collect the radiation emanating from the interaction chamber 21, in the form of a beam 23 that irradiates the wafer OBJ with EUV through an irradiation window 40, which will hereafter be called "window" for short. In fact, this beam is formed from a succession of pulses $I_1$ to $I_N$. Advantageously, the wafer OBJ is displaced (arrow 41) relative to the window 40 and to the beam 23. This displacement 41 preferably has an increment p that depends on the width L of the window 40 (taken in the direction of the displacement 41). More particularly, this width L and the displacement increment p are related through the equation L=Np, where N is the predetermined number of exposures of any one region of the wafer OBJ to the EUV radiation. Moreover, the speed V of relative displacement 41 is such that an increment p is traveled in a time corresponding to the EUV pulse repetition period T. Thus, the speed V is given by the equation V=pF, where F is the frequency of the EUV pulses. Each region, the width of which corresponds to the increment p, which receives the radiation through the window 40, is in fact exposed N times, where N is the aforementioned predetermined number. In a preferred embodiment, this number N is 50.

More precisely, in one embodiment imposed in practice by integrated circuit manufacturers, the process is carried out as follows. The EUV source emits pulsed radiation, typically at a frequency of 10 kHz as indicated above, which corresponds to one pulse every 0.1 ms. The emitted radiation is then collected in one direction (arrow 23 in FIG. 1) and then directed through the window 40 onto a mask (not shown) for the circuit to be lithographed. This mask is imaged onto the silicon wafer OBJ with a magnification of 0.25 in such a way that the dimensions of the image of the window on the silicon are 26 mm×2 mm. Depending on the speed of displacement of the mask and of the window 40, each band on the silicon wafer of width corresponding to a displacement increment p of the window receives a certain energy dose. This total energy dose $W_{tot}$ is for example set at 5 mJ/cm$^2$. To achieve this energy with for example a 115 W source operating at 10 kHz, each band of the zone exposed will have to receive a dose of 50 pulses. The speed of displacement of the image of the window 40 over the silicon wafer OBJ is then adapted so that, during the preferably continuous displacement of the silicon wafer, each band is exposed to 50 pulses. Consequently, the width of the window 40 at the silicon wafer corresponds to 50 times the displacement increment p of the wafer between two successive pulses.

A complete etching pattern is reproduced by continuously moving the silicon wafer OBJ relative to the EUV source and to the window 40. This movement, considered as continuous in process terms, may be either carried out by a stepper motor or else by an effectively continuous motor. In the latter case, since the EUV pulses are very short, the displacements of the object may be considered as practically zero over the duration of an EUV pulse. However, between two light pulses, the silicon wafer is displaced to a certain distance corresponding to the aforementioned increment p. The energy dose needed for the exposure corresponds in the example described to 50 EUV pulses. The standard deviation in the distribution of the doses must be less than 0.1%, which corresponds in open-loop shot-by-shot noise to a standard deviation of 1%. Because of the many uncertainties associated with the EUV source, it may be difficult to ensure this 1% shot-by-shot noise constraint. Control of the received dose therefore requires a closed-loop feedback mechanism that has to ensure this constraint while still allowing greater tolerance on the shot-by-shot noise. The expression "shot-by-shot noise" is understood to mean the uncontrolled fluctuation in the energy of the pulses emitted.

In the example described, the laser sources are preferably chosen so that, if $W_{max}$ corresponds to the maximum energy of a pulse $I_1$ achieved with ten simultaneous laser shots, the total energy dose $W_{tot}$ that each exposed region receives is such that $W_{tot}$=40 $W_{max}$, while keeping in mind that this total dose $W_{tot}$ must be achieved from 50 emitted pulses. It will be understood that by regulating the energy of the emitted pulses, by means of a time delay in the laser shots, it is possible in particular to increase the tolerance of the system to the "shot-by-shot" noise while ensuring that the energy dose of the source is stable.

This regulation, preferably based on a closed-loop feedback mechanism will be described below.

Before reaching the silicon wafer OBJ, part of the EUV radiation 23 is tapped off unattenuated to a sensor 31 that measures the surface illumination produced by a current pulse. This sensor may be a photodiode or CCD camera. Advantageously, the response time of such a sensor 31 is sufficiently rapid to be able to take measurements at a frequency of at least 10 kHz. The measurement is then communicated to a computer system that incorporates the control unit 30 (the feedback loop being represented by the arrow 32 in FIG. 1). To simplify the drawing of FIG. 1, the sensor 31 has been shown between the EUV source and the window 40. In practice, this sensor 31 is placed instead after the window 40 in the path of the radiation 23 (practically on the wafer OBJ) so that the measurement of the EUV peak power that the wafer OBJ actually receives is the most accurate possible.

The computing system 33 of FIG. 4 provides several functions. It consists of a conventional hardware architecture. It may be a microcontroller integrating a memory, a processor, a clock or the like, or else a microprocessor integrating input/output acquisition cards and allowing various functions to be implemented. Owing to the very considerable time constraint, consisting in measuring the EUV peak power every 0.1 ms, the calculation of the control signal to be applied, its application and the flow of information must be executed in real time. The control signals for the instants of firing $t_{10}$ to $t_{20}$ are therefore programmed and executed in a real-time environment. The processor CS equipping the computing system 33 is of course of recent generation, capable of executing all these functions at a frequency greater than the frequency of the emitted EUV pulses. More particularly, the sensor 31 (of rapid acquisition) and the computing system 33, for carrying out these calculations, may operate jointly over a period shorter than the EUV pulse repetition period.

Figure 5:
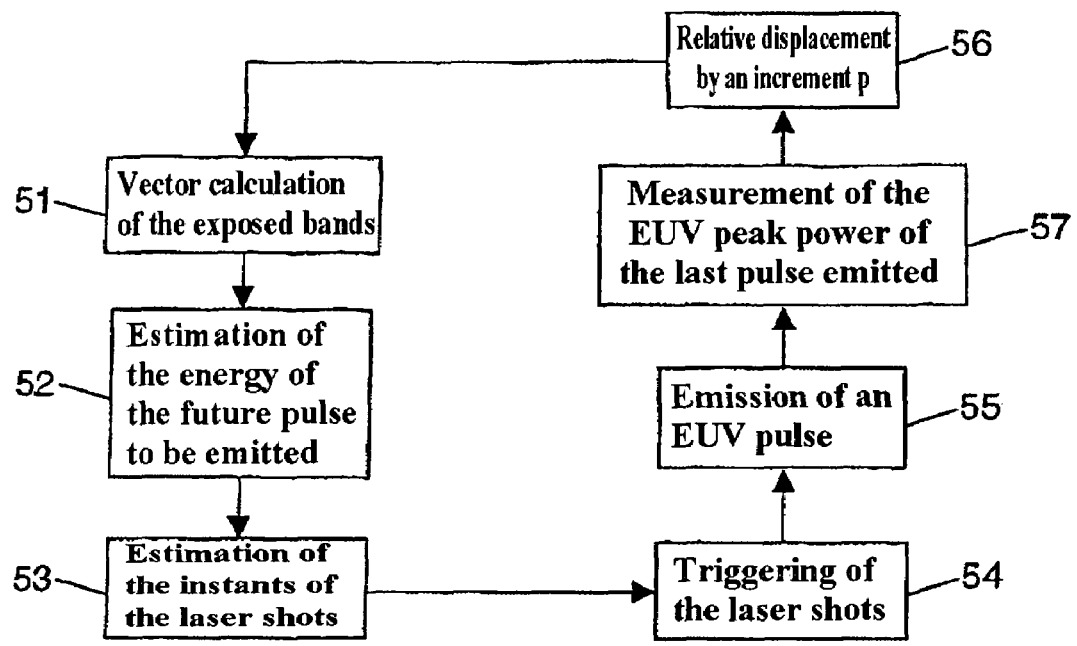
FIG. 5 shows schematically the steps of a process according to the invention.

The successive steps of the feedback loop control will now be described with reference to FIG. 5.

After one or more pulses have been emitted and sent to the wafer OBJ, at step 51, the "state of the exposed bands", that is to say the respective doses that the bands of the zone being exposed to the EUV radiation have received up till now, is calculated, taking into account the measurement of the EUV peak power of the last pulse emitted (measured at step 57). A "state" vector containing 50 components representing the state of the 50 bands that have just been exposed is thus constructed. At each shot, the components of the vector are shifted in order to update it, such that the component associated with the band exposed for the last time leaves the vector, while a new component associated with a band that will be exposed for the first time enters the vector. This shift is carried out so as to take into account the displacement of the exposed zone of the wafer OBJ, this zone being displaced between two shots.

At step 52, a calculation is made, on the basis of a dose associated with a future exiting band, the energy that will have to be supplied to this band exposed for the last time to the next EUV pulse in order to achieve the required dose $W_{tot}$. This EUV pulse energy is then converted into a contribution of energy quanta delivered by the laser sources, taking into account the degree of conversion of the energy of the laser shots into the EUV energy. The energy of the future pulse to be delivered is refined by introducing a time delay into the instants of the laser shot pulses, as described above. At step 53, the appropriate instants of the future laser shots are then estimated. By temporally superimposing only some of the energy quanta delivered by the shots, it is then possible to achieve a very fine discretization in the control of the EUV energy that it is desired to assign to the future pulse. At step 54, laser shots are triggered at the instants estimated at step 53, thereby generating, at step 55, an EUV pulse of chosen energy. The process continues by measuring, at step 57, the effective EUV peak power of the pulse emitted at step 55, and by the relative displacement at step 56 of the wafer, by an increment p, with respect to the window and to the EUV radiation source. In this FIG. 5, on the left of the figure, calculation steps carried out by the computing system 33 have therefore been shown.

Thus, in this method of implementation, the actual regulation is preferably carried out for the last pulse to be emitted in a current band of the zone of the wafer OBJ exposed to the radiation.

Figure 6A:
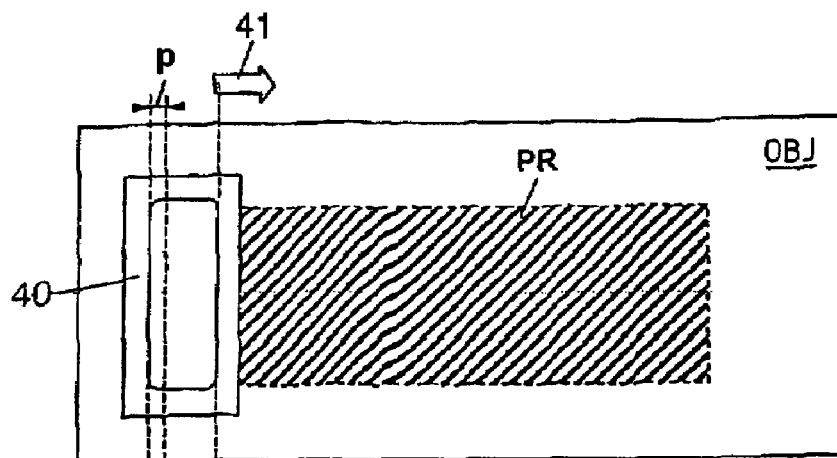
FIGS. 6a to 6d show schematically the position of the irradiation window in successive positions during the irradiation of the object OBJ.
Figure 6B:
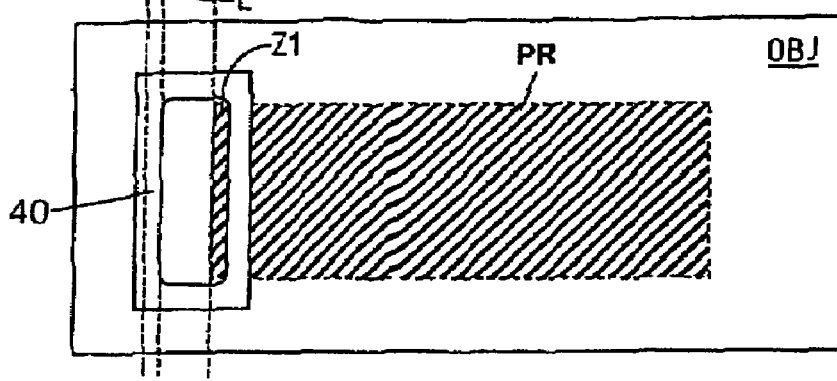

FIGS. 6a to 6d show, by the hatched areas, the photosensitive zone created by the deposition of a film of photoresist PR on the surface of the wafer OBJ. FIG. 6a shows the position of the window 40 at the instant at which the exposure process starts. The window 40 is then displaced by a position increment p corresponding to the width L of the window divided by the number N of pulses to be delivered into any one band of the zone exposed to the radiation. This corresponds to the position of the window shown in FIG. 6b. A first EUV pulse is sent in this configuration shown in FIG. 6b. The EUV peak power is measured during this first emitted pulse and then integrated over the duration of the pulse, while the window 40 continues to be moved relative to the wafer OBJ by the increment p, in accordance with the regulation method described above with reference to FIG. 5. In a preferred method of implementation and in an intermediate configuration between FIGS. 6b and 6c in which the zone of the wafer OBJ to be exposed located beneath the irradiation window is narrower than this window, the energy of the pulse to be emitted is estimated by subtracting, from the energy $W_{tot}$ to be delivered in order to irradiate the current photosensitive surface, the sum of the energies measured during the preceding n successive pulses and then by dividing the result of this subtraction by N−n (where N=50 in the example described and n is of course less than N). Thus, it will be understood that the number n is incremented after each measurement of. the EUV peak power of a delivered pulse, followed by the calculation of its integral giving the energy actually received. To adjust the energy of the pulses emitted, it will be advantageous to use composite salvos of laser shots of the type shown in FIG. 3b, with successive time delays of the shots 5, 6 remaining shorter than the duration Δt of the shots.

When the zone to be exposed, of the object located beneath the irradiation window, is wider than the width of the window (the configuration shown in FIG. 6c), the exact energy remaining to be delivered in order for the slice (or "band" as denoted previously) of the zone to be exposed undergoing its last irradiation in order to obtain the total quantity of energy needed to photoetch it, is estimated.

Figure 6C:
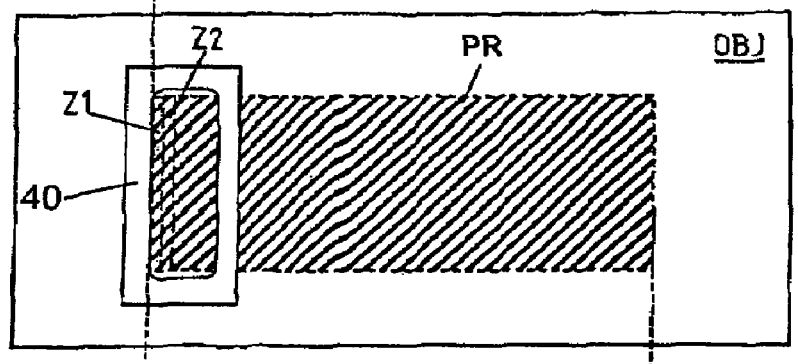
Figure 6D:
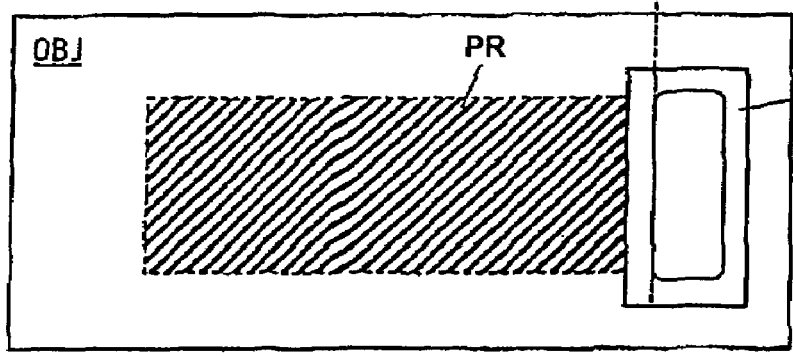

By way of illustration, FIG. 6c shows the position of the window 40 in which it now allows full irradiation of the photosensitive region of the wafer OBJ. The band Z1 that was irradiated first in FIG. 6b now receives its last (fiftieth) pulse, regulated according to the procedure described above, while the immediately adjacent band Z2 (to the right in FIG. 6c) receives its 49th pulse. When the window 40 has again been moved by an increment p, it is this immediately adjacent band Z2 that then receives the fiftieth pulse, of energy regulated according to the energy dose that it has received previously, for the purpose of achieving the aforementioned total energy dose denoted $W_{tot}$. Thus, it will be understood in general that the first pulse among the N pulses (here N=50) that an nth current band has to receive during the irradiation corresponds in fact to an nth pulse since the start of the photoetching process. The irradiation process continues, shown in FIG. 6d, until the edge of the photosensitive region (to the right in FIG. 6d) has been reached.

Thus, the start of the irradiation process may be summarized as follows:

a0) the photosensitive object to be lithographed is positioned beneath the window so that only a zone slice to be irradiated that has a width equal to said fraction 1/N of the window width is exposed;

a1) at least some of the laser sources are: selected so as to excite the plasma-generating target and to trigger a current pulse in the zone to be irradiated;

a2) the peak power of the current extreme ultraviolet pulse actually delivered to the zone of the object to be irradiated is measured, and its integral over the duration of the pulse is calculated;

a3) the object is displaced relative to the window by a position increment equal to said fraction 1/N of the window width;

a4) steps a1) to a3) are repeated as long as the zone of the object to be irradiated, located beneath the window, is narrower than the window, by delivering pulses with energies estimated by subtracting, from the energy ($W_{tot}$) to be delivered for photoetching the object, the sum of the energies measured during the n successive passes through step a2), and then by dividing the result of the subtraction by N−n, where n is an integer smaller than the predetermined number of pulses N; and a5) when the zone of the object to be irradiated, located beneath the window, reaches the width of the window, the precise amount of energy remaining to be provided is estimated, so that the slice of the zone to be photoetched receiving its final pulse receives the total quantity of energy ($W_{tot}$) for photoetching it.

More generally, tests have shown that the use of a feedback mechanism of the type described above ensures that the dose stability has a standard deviation of 0.1%, while still permitting a shot-by-shot noise with a standard deviation possibly up to 4% when a fine control of the time delays in the laser shots is used as described above.

The invention claimed is:

1. An extreme ultraviolet photolithography method in which:

an object to be lithographed possesses a plane surface, placed orthogonally to the light radiation and having a photosensitive zone, this object being able to be moved transversely to this radiation;

the radiation carrying out the etching operation includes at least one line in the extreme ultraviolet and consists of N successive current pulses whose energy per unit area through an irradiation window is measured; and these radiation pulses are produced by the impact, on a suitable target, of at least two laser beams output by pulsed laser sources chosen from a plurality thereof, each emitting at each triggering a quantum of energy of given duration Δt, these laser sources being focused at the same point on the target, this method comprising the following iterative steps, stated for an nth iteration:

a) integration of the energy per unit area of extreme ultraviolet radiation that has passed through the irradiation window during the N−1 last pulses;

b) during the time interval separating two successive radiation pulses, translation of the photosensitive object through a distance equal to a fraction 1/N of the width of the irradiation window along the axis of this translation;

c) subtraction of the integral obtained in step a) from the quantity of energy needed for the photoetching process;

d) determination of a quantity of energy remaining to be provided in order to reach this quantity of energy needed for the photoetching process;

e) calculation of the number of pulse quanta remaining to be generated for an $n^{th}$ pulse;

f) determination of the corresponding number of laser sources to be fired and selection of laser sources whose number is equal to the integer part of this number; and g) synchronous triggering of the lasers selected at step f), these steps a) to g) being repeated for the next iterative point and wherein the number of laser sources calculated at step f) is fractional and the quantity of energy less than one quantum, associated with this fractional part of the number of lasers, is provided by a laser source capable of delivering the quantum of energy common to the other laser sources and is triggered with a delay, of less than the duration $\Delta t$ of a quantum, relative to the instant of synchronous triggering of the other laser sources that deliver the integer part of the number of quanta of the same current pulse.

2. The method as claimed in claim 1, wherein the number of laser sources calculated at step f) is fractional and the quantity of energy less than one quantum, associated with this fractional part of the number of lasers, is provided by several laser sources of which:

the first is triggered with a delay of $(1-k_1)\Delta t$, where $0<k_1<1$, $k_1$ being a constant associated with the first source, after the instant of triggering of the synchronous lasers that represent the integer part of the number of lasers;

the second is triggered with a delay of $(1-k_2)\Delta t$, where $k_1<k_2<1$, $k_2$ being a constant associated with the second source, after the instant of triggering of the synchronous lasers that represent the integer part of the number of lasers;

and so on, the $q^{th}$ being triggered with a delay of $(1-k_q)\Delta t$, where $0<k_q<1$, $k_q$ being a constant associated with the $q^{th}$ source, after the instant of triggering of the synchronous lasers that represent the integer part of the number of lasers; and, furthermore the sum of these delays is less than the duration $\Delta t$ of a quantum.

3. The method as claimed in claim 1, the following are triggered:

at least a first laser shot at a predetermined instant ($t_{11}$), and one or more successive laser shots at respective instants chosen to adjust the energy of an extreme ultraviolet pulse to be emitted, these respective instants being distributed within a time interval shorter than said duration ($\Delta t$) of the shots.

4. The method as claimed in claim 1, wherein the number of laser sources calculated at step f) is fractional and the quantity of energy less than one quantum, associated with this fractional part of the number of lasers, is provided by a laser source capable of delivering an amount of energy of less than one quantum and triggered with a delay, of less than the duration of a quantum, relative to the instant of synchronous triggering of the other laser sources that deliver the integer part of the number of quanta of the same current pulse.

5. The method as claimed in claim 4, wherein the laser sources are actuated so as to emit laser shots repetitively with a mean frequency substantially defining a repetition period of the pulses that emit the plasma and in that the displacement of the object relative to the radiation is substantially continuous with a speed (V) corresponding to a fraction 1/N of the width of the window (L) divided by a pulse repetition period.

6. The method as claimed in claim 5, wherein it commences substantially with the following steps:

a0) the photosensitive object to be lithographed is positioned beneath the window so that only a zone slice to be irradiated that has a width equal to said fraction 1/N of the window width is exposed;

a1) at least some of the laser sources are selected so as to excite the plasma-generating target, and a current pulse in the zone to be irradiated is triggered;

a2) the peak power of the current extreme ultraviolet pulse actually delivered to the zone of the object to be irradiated is measured;

a3) the object is displaced relative to the window by a position increment equal to said fraction 1/N of the window width;

a4) steps a1) to a3) are repeated as long as the zone of the object to be irradiated, located beneath the window, is narrower than the window, by delivering pulses with energies estimated by subtracting, from the energy to be delivered for photoetching the object, the sum of the energies measured during the n successive passes through step a2), and then by dividing the result of the subtraction by N−n, where n is an integer smaller than the predetermined number of pulses N; and a5) when the zone of the object to be irradiated, located beneath the window, reaches the width of the window, the precise amount of energy remaining to be provided is estimated, so that the slice of the zone to be photoetched receiving its final pulse receives the total quantity of energy for photoetching it.

7. The method as claimed in claim 4, wherein the following are triggered:

at least a first laser shot at a predetermined instant ($t_{11}$), and one or more successive laser shots at respective instants chosen to adjust the energy of an extreme ultraviolet pulse to be emitted, these respective instants being distributed within a time interval shorter than said duration $\Delta t$ of the shots.

8. An extreme ultraviolet photolithography device comprising:

a source of extreme ultraviolet radiation, comprising at least two laser beams output by pulsed laser sources, each emitting a quantum of energy of given duration $\Delta t$ during a laser shot and capable of exciting one and the same region of a target that is able to emit a plasma possessing an emission line in the extreme ultraviolet;

an irradiation window of chosen width, interposed between the radiation source and the object and stationary relative to the radiation source; and means for the transverse displacement, relative to the window, of an object to be photolithographed that has a plane surface, orthogonal to the radiation, and has a photosensitive zone, said displacement being chosen so that, between two successive pulses of extreme ultraviolet radiation, the transverse displacement of the object relative to the window is a fraction 1/N of the width of the irradiation window in the direction of the displacement, in such a way that any one band of said zone of the object is exposed to a predetermined number N of successive pulses in the extreme ultraviolet, wherein the extreme ultraviolet photolithography device comprises:

means for measuring the energy per unit area of the radiation through the irradiation window;

means for calculating, for the current $n^{th}$ pulse to be delivered:
   the sum of the measured energy of the extreme ultraviolet radiation of the N−1 last pulses,
   the quantity of energy remaining to be delivered by the nth pulse, by comparing said sum with a predetermined total energy dose needed for the photoetching, and
   the number of quanta of energy that the laser sources have to deliver in order to obtain said quantity of energy of said $n^{th}$ pulse; and means for selecting and controlling, synchronously, a chosen number of lasers according to the calculated number of quanta, and wherein the means for displacing the object to be photoetched relative to the radiation are active, so as subsequently to displace the object by an increment equivalent to said fraction 1/N of the width of the window, and wherein the calculation means are designed to estimate instants of laser firings in order to adjust the energy of a pulse to be emitted in the extreme ultraviolet and in that the control means are designed to introduce a time delay in the laser firings within a time interval between shots that is shorter than said duration Δt of the shots.

9. The device as claimed in claim 8, wherein the control means comprise acoustooptic modulators, for actuating each laser source at a chosen instant, and a radiofrequency power supply for actuating said acoustooptic modulators and in that said power supply and said modulators are capable of operating at a maximum frequency greater, by at least a factor of the order of a thousand, than the frequency of the extreme ultraviolet pulses.

10. The device as claimed in claim 8, wherein said energy measuring means comprise a sensor which has a chosen acquisition time said calculating means being equipped with a processor having a chosen processing frequency, in such a way that the sensor and the calculating means are capable of operating jointly over a period shorter than the extreme ultraviolet pulse repetition period.

11. The device as claimed in claim 8, wherein said target is a xenon jet.

12. The device as claimed in claim 8, wherein said target is a directed jet of particles comprising xenon and/or water microdroplets in the form of a mist.

13. The device as claimed in claim 8, wherein the laser shots are output by pulsed solid-state lasers operating as oscillators and pumped by continuously operating diodes.

14. The device as claimed in claim 8, wherein the fractional part of the number of lasers is represented by a quantum of energy delayed with respect to the synchronous triggering of the previous lasers and in that the selection means are capable of generating these delays according to the magnitude of the fractional part of the number of lasers, in order to generate said current $n^{th}$ pulse.

15. The device as claimed in claim 8, wherein the selection means are designed to trigger a remaining number of lasers not contributing to the emission of an extreme ultraviolet pulse, separately, so that the separate shots, output by these lasers, are not sufficient to emit an extreme ultraviolet pulse.

* * * * *